(12) United States Patent
Zhang et al.

(10) Patent No.: US 9,971,437 B2
(45) Date of Patent: May 15, 2018

(54) ARRAY SUBSTRATE, DISPLAY DEVICE HAVING THE SAME, AND MANUFACTURING METHOD THEREOF

(71) Applicant: BOE TECHNOLOGY GROUP CO., LTD., Beijing (CN)

(72) Inventors: Wenlin Zhang, Beijing (CN); Woo-Bong Lee, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 67 days.

(21) Appl. No.: 15/030,594

(22) PCT Filed: Dec. 10, 2015

(86) PCT No.: PCT/CN2015/097027
§ 371 (c)(1),
(2) Date: Apr. 20, 2016

(87) PCT Pub. No.: WO2016/180013
PCT Pub. Date: Nov. 17, 2016

(65) Prior Publication Data
US 2016/0334909 A1 Nov. 17, 2016

(30) Foreign Application Priority Data

May 14, 2015 (CN) .......................... 2015 1 0246822

(51) Int. Cl.
*G06F 3/041* (2006.01)
*G06F 3/044* (2006.01)
(Continued)

(52) U.S. Cl.
CPC .......... *G06F 3/0412* (2013.01); *G02F 1/1368* (2013.01); *G02F 1/13338* (2013.01);
(Continued)

(58) Field of Classification Search
CPC ...... G06F 3/0412; G06F 3/044; G06F 3/0416; G06F 2203/04103; G02F 1/1368; G02F 1/13338; G02F 2202/10; H01L 27/1225
(Continued)

(56) References Cited

U.S. PATENT DOCUMENTS

2011/0163979 A1* 7/2011 Kim ...................... G06F 3/0412
345/173
2012/0112195 A1* 5/2012 Li ........................ H01L 27/1288
257/59
(Continued)

FOREIGN PATENT DOCUMENTS

CN 103699284 A 4/2014
CN 104461142 A 3/2015
(Continued)

OTHER PUBLICATIONS

First Office Action in the Chinese Patent Application No. 201510246822.2, dated Jun. 26, 2017; English translation attached.
(Continued)

*Primary Examiner* — Moin Rahman
(74) *Attorney, Agent, or Firm* — Intellectual Valley Law, P.C.

(57) ABSTRACT

The present application discloses an array substrate comprising an active layer; and a plurality of touch electrodes in a same layer as the active layer.

20 Claims, 6 Drawing Sheets (51) Int. Cl.
   *G02F 1/1333* (2006.01)
   *G02F 1/1368* (2006.01)
   *H01L 27/12* (2006.01)

(52) U.S. Cl.
   CPC ............ *G06F 3/044* (2013.01); *G06F 3/0416* (2013.01); *G02F 2202/10* (2013.01); *G06F 2203/04103* (2013.01); *H01L 27/1225* (2013.01)

(58) Field of Classification Search
   USPC ................ 257/43, 59, 98, 72, 71, 40, 66, 48
   See application file for complete search history.

(56) References Cited

U.S. PATENT DOCUMENTS

| | | | | |
|---|---|---|---|---|
| 2013/0207087 A1* | 8/2013 | Kim | ............... | H01L 27/3225 257/40 |
| 2014/0139774 A1* | 5/2014 | Tsai | ............... | H01L 27/3258 349/43 |
| 2014/0184559 A1 | 7/2014 | Han et al. | | |
| 2015/0145812 A1* | 5/2015 | Sun | ............... | G06F 3/044 345/174 |
| 2016/0342251 A1 | 11/2016 | Chen et al. | | |
| 2016/0342260 A1 | 11/2016 | Qin et al. | | |
| 2017/0184896 A1 | 6/2017 | Zhao | | |

FOREIGN PATENT DOCUMENTS

| | | |
|---|---|---|
| CN | 104461207 A | 3/2015 |
| CN | 104503622 A | 4/2015 |
| CN | 104503647 A | 4/2015 |
| CN | 104571765 A | 4/2015 |
| CN | 104915054 A | 9/2015 |
| EP | 2750002 A2 | 7/2014 |
| KR | 20140087431 A | 7/2014 |

OTHER PUBLICATIONS

International Search Report & Written Opinion dated Feb. 29, 2016 regarding PCT/CN2015/097027.

Second Office Action in the Chinese Patent Application No. 201510246822.2, dated Jan. 10, 2018; English translation attached.

\* cited by examiner

ARRAY SUBSTRATE, DISPLAY DEVICE HAVING THE SAME, AND MANUFACTURING METHOD THEREOF

CROSS-REFERENCE TO RELATED APPLICATION

This application is a national stage application under 35 U.S.C. § 371 of International Application No. PCT/CN2015/097027 filed Dec. 10, 2015, which claims priority to Chinese Patent Application No. 201510246822.2, filed May 14, 2015, the contents of which are incorporated by reference in the entirety.

FIELD

The present invention relates to display technology, more particularly, to an array substrate, a display device having the same, and a manufacturing method thereof.

BACKGROUND

Conventional touch control display panels typically use indium tin oxide (ITO) as the touch electrode material. For large size display, there are some issues with indium tin oxide touch electrodes. Because indium tin oxide has a relatively large resistance, a larger size display inevitably demands an ITO touch electrode having a relatively larger thickness, which results in a lower light transmission rate. Thus, it is difficult to use ITO as the touch electrode material in a large size display panel.

SUMMARY

In one aspect, the present invention provides an array substrate comprising an active layer and a plurality of touch electrodes in a same layer as the active layer.

Optionally, the active layer comprises a semi-conductive material, and the plurality of touch electrodes comprise a conductive material, the conductive material comprises at least one element in common with the semi-conductive material.

Optionally, the conductive material is converted from the semi-conductive material by a plasma treatment, and patterns corresponding to the active layer and the plurality of touch electrodes are formed in a single process.

Optionally, the active layer comprises a metal oxide semi-conductive material, the plurality of touch electrodes comprise a reductive plasma-treated metal oxide semi-conductive material.

Optionally, the metal oxide semi-conductive material comprises indium gallium zinc oxide.

Optionally, the plurality of touch electrodes comprise a $H_2$ or $NH_3$ plasma-treated indium gallium zinc oxide.

Optionally, the plurality of touch electrodes comprise a conductive material, and the active layer comprises a semi-conductive material converted from the conductive material by a plasma treatment.

Optionally, the plurality of touch electrodes comprise a metal, and the active layer comprises an oxidative plasma-treated metal material.

Optionally, the plurality of touch electrodes comprises a plurality rows of first touch electrodes and a plurality of second touch electrodes, each of the plurality rows of first touch electrodes extends substantially along a first direction and comprises a plurality of first touch electrodes spaced apart along the first direction; each of the plurality of second touch electrodes extends substantially along a second direction.

Optionally, the array substrate further comprises a first passivation layer above the active layer; and a plurality of first touch electrode connection lines on a side of the first passivation layer distal to the active layer, each of the plurality of first touch electrode connection lines extends substantially along the first direction.

Optionally, each of the plurality of first touch electrode connection lines is connected to the plurality of first touch electrodes in each of the plurality rows of first touch electrodes through a plurality of third vias in the first passivation layer.

Optionally, the array substrate further comprises a second passivation layer on a side of the first passivation layer distal to the active layer; and a pixel electrode on a side of the second passivation layer distal to the active layer.

Optionally, the pixel electrode is connected to the drain electrode through a fourth via in the first passivation layer and a fifth via in the second passivation layer.

Optionally, the array substrate further comprises a common electrode on a side of the pixel electrode distal to the active layer; a first common electrode connection line connected to the common electrode, a second common electrode connection line connected to the plurality rows of first touch electrodes, and a third common electrode connection line connected to the plurality of second touch electrodes; and a first switch in the second common electrode connection line and a second switch in the third common electrode connection line.

Optionally, the array substrate further comprises an etch stop layer on a side of the active layer proximal to the first passivation layer; and a source electrode and a drain electrode on a side of the etch stop layer distal to the active layer; the source electrode connected to the active layer through a first via in the etch stop layer, the drain electrode connected to the active layer through a second via in the etch stop layer.

Optionally, the plurality of touch electrodes are operated in a time-division driving mode.

In another aspect, the present invention provides a display device comprising an array substrate described herein.

In another aspect, the present invention provides a method of manufacturing an array substrate, comprising forming a semi-conductive material layer; etching the semi-conductive material layer to form an active layer region and a touch electrode region; and treating the touch electrode region thereby forming a plurality of touch electrodes.

Optionally, the method further comprises coating a photoresist layer on the semi-conductive material layer; exposing the photoresist layer with a gray-tone mask plate or a half-tone mask plate; developing the exposed photoresist layer to obtain a photoresist pattern comprising a first section corresponding to the active layer region, second section corresponding to the touch electrode region, and a third section which is outside the first section and the second section; the depth of first section is larger than that of the second section, the photoresist layer is removed in the third section; etching the semi-conductive material layer in the third section; ashing the photoresist layer to remove the photoresist layer in the second section while maintaining the photoresist layer in the third section; and removing the photoresist layer in the first section after the step of treating the touch electrode region.

Optionally, the semi-conductive material comprises a metal oxide semi-conductive material, and the treating comprises a reductive plasma-treatment.

Optionally, the semi-conductive material comprises indium gallium zinc oxide.

Optionally, the treating step comprises a plasma treatment with $H_2$ or $NH_3$.

Optionally, the touch electrode region comprises a plurality rows of first touch electrode blocks and a plurality of second touch electrode blocks, each of the plurality rows of first touch electrode blocks extends substantially along a first direction and comprises a plurality of first touch electrode blocks spaced apart along the first direction; each of the plurality of second touch electrode blocks extends substantially along a second direction; and the plurality of touch electrodes comprises a plurality rows of first touch electrodes and a plurality of second touch electrodes, each of the plurality rows of first touch electrodes extends substantially along the first direction and comprises a plurality of first touch electrodes spaced apart along the first direction; each of the plurality of second touch electrodes extends substantially along the second direction.

Optionally, the method further comprises forming a first passivation layer above the active layer; forming a plurality of third vias in the first passivation layer; and forming a plurality of first touch electrode connection lines on a side of the first passivation layer distal to the active layer.

Optionally, each of the plurality of first touch electrode connection lines extends substantially along the first direction, and each of the plurality of first touch electrode connection lines is connected to the plurality of first touch electrodes in each of the plurality of rows of first touch electrodes through the plurality of third vias.

Optionally, the method further comprises forming a fourth via in the first passivation layer; forming a second passivation layer on a side of the first passivation layer distal to the active layer; forming a fifth via in the second passivation layer; and forming a pixel electrode on a side of the second passivation layer distal to the active layer, wherein the pixel electrode is connected to the drain electrode through the fourth via and the fifth via.

Optionally, the method further comprises forming an etch stop layer on a side of the active layer proximal to the first passivation layer; forming a first via and a second via in the etch stop layer; and forming a source electrode and a drain electrode on a side of the etch stop layer distal to the active layer, the source electrode is connected to the active layer through the first via, and the drain electrode is connected to the active layer through the second via.

Optionally, the method further comprises forming a common electrode on a side of the pixel electrode distal to the active layer; forming a first common electrode connection line connected to the common electrode, forming a second common electrode connection line connected to the plurality rows of first touch electrodes, and forming a third common electrode connection line connected to the plurality of second touch electrodes; and forming a first switch in the second common electrode connection line and forming a second switch in the third common electrode connection line.

BRIEF DESCRIPTION OF THE FIGURES

The following drawings are merely examples for illustrative purposes according to various disclosed embodiments and are not intended to limit the scope of the present invention.

DETAILED DESCRIPTION OF THE EMBODIMENTS

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
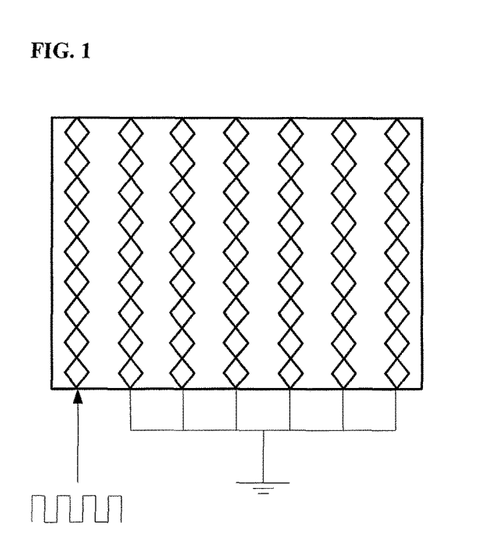
FIGS. 1-2 are diagrams illustrating the working principle of a conventional touch substrate.
Figure 2:
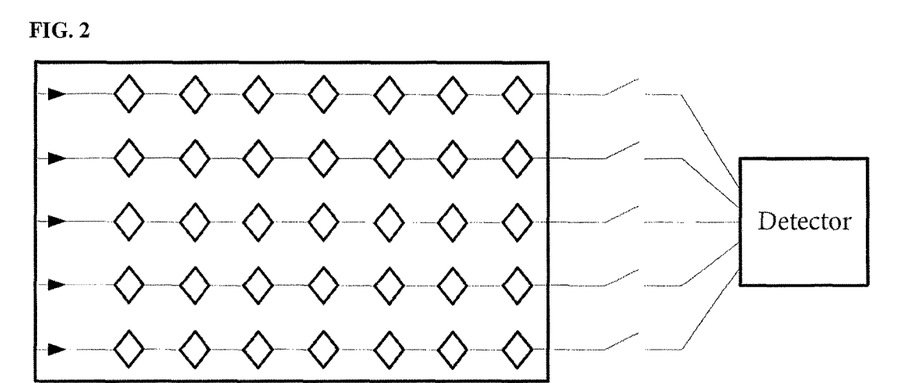

Conventional touch control devices may use on-cell touch control technology or in-cell touch control technology. FIGS. 1 and 2 are diagrams illustrating the working principle of a conventional in-cell touch substrate. As shown in FIG. 1, a pulse signal is input into each column of first touch electrodes while the other columns are connected to ground. As shown in FIG. 2, each row of second touch electrodes is checked for capacitance change. The cross-point of a column of first electrodes and a row of second electrodes having capacitance change is determined to be a touch point. Separate patterning processes are required for forming the touch electrodes in the conventional touch substrates. The embodiments of the present disclosure provide a touch substrate having superior electronic properties and significantly simplified manufacturing process.

Figure 3:
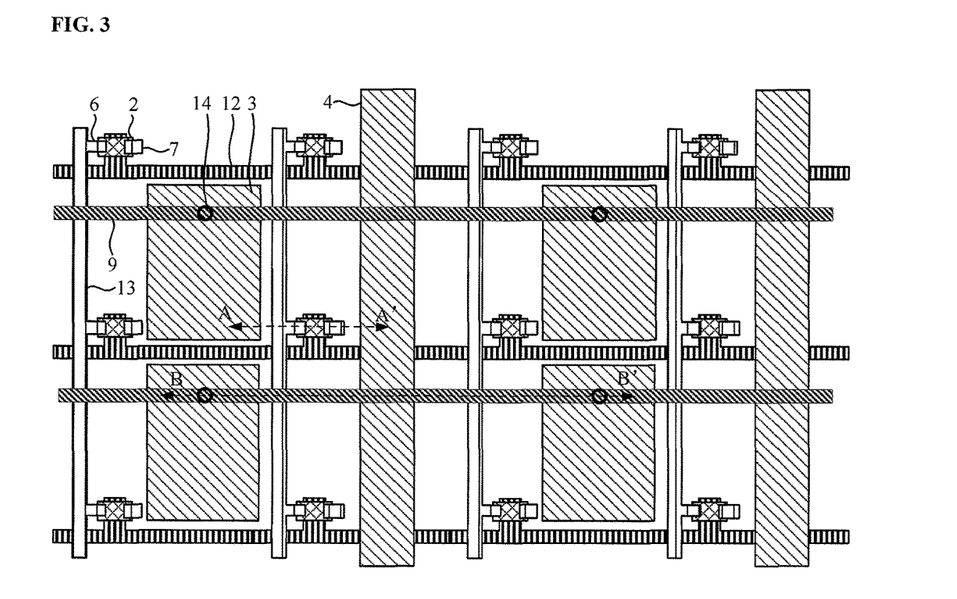
FIG. 3 is a diagram illustrating the structure of a touch substrate in some embodiments.
Figure 4:
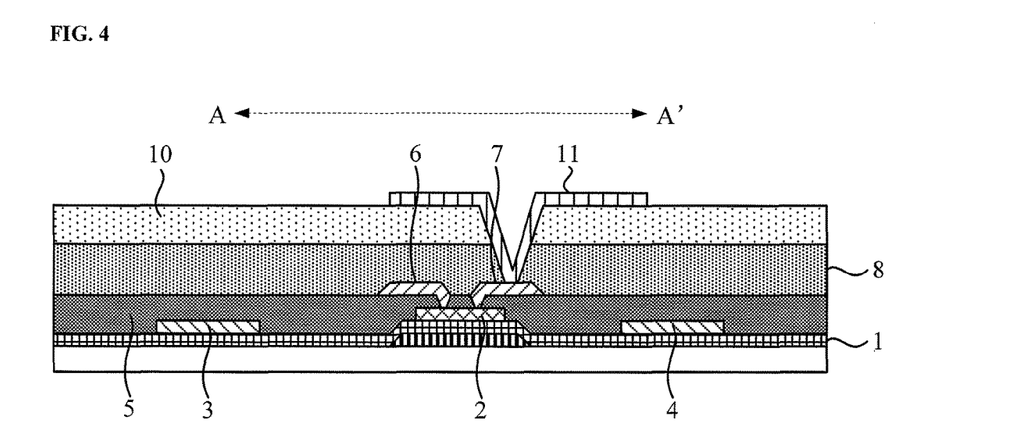
FIG. 4 is a cross-sectional view along the A-A' direction of the touch substrate in FIG. 3.

FIG. 3 is a diagram illustrating the structure of a touch substrate in some embodiments. FIG. 4 is a cross-sectional view along the A-A' direction of the touch substrate in FIG. 3. Referring to FIGS. 3 and 4, the array substrate in the embodiment includes an active layer 2, and a plurality of touch electrodes in a same layer as the active layer 2. The plurality of touch electrodes in the embodiment include a plurality first touch electrodes 3 and a plurality of second touch electrodes 4. For example, the array substrate in the embodiment includes an active layer 2, and a plurality rows of first touch electrodes 3 and a plurality of second touch electrodes 4 in a same layer as the active layer 2. As illustrated in FIG. 3, each row of first touch electrodes 3 extends substantially along a first direction (e.g., the row direction in FIG. 3). Each tow of first touch electrodes 3 includes a plurality of first touch electrodes 3 spaced apart along the first direction. In FIG. 3, each second touch electrodes 4 extends substantially along a second direction (e.g., the column direction in FIG. 3). Optionally, the first touch electrode 3 is a sensing electrode ($R_x$). Optionally, the second touch electrode 4 is a scanning electrode ($T_x$).

Having the touch electrodes in a same layer as the active layer 2 obviates the separate patterning processes for forming the touch electrodes. It also reduces the thickness of the touch control structure. The manufacturing process is much simplified and the electronic properties of the touch control panel are significantly improved.

Referring to FIG. 3, the array substrate in the embodiment also includes a plurality of gate lines 12 connected to the gate electrodes, a plurality of data lines 13 connected to the source electrodes 6. The plurality of gate lines 12 and the plurality of data lines 13 define a plurality of pixel units.

In some embodiments, the active layer 2 includes a semi-conductive material, and the plurality of touch electrodes (e.g., the plurality of first touch electrodes and the plurality of second touch electrodes) include a conductive material converted from the semi-conductive material by a plasma treatment.

In some embodiments, the active layer 2 includes a metal oxide semiconductor material. Various metal oxide semiconductor material may be used for making the active layer 2. For example, the active layer 2 can be made of indium gallium zinc oxide (IGZO). IGZO is a non-crystalline oxide material containing indium, gallium, and zinc, having a charge carrier mobility around 20-30 times that of a non-crystalline silicone. Using a metal oxide material such as IGZO greatly enhances the charge/discharge rate of the pixel electrode, increases the response rate of the pixel electrode, and achieving a faster refresh rate. Higher response rate also leads to a dramatically increased pixel scan rate, enabling ultra-high resolution in thin film transistor liquid crystal display.

Metal oxide materials such as IGZO have superior semiconductor properties suitable for making the active layer 2. Moreover, they can be converted into conductive material by certain treatments such as a plasma treatment. Optionally, the treatment is a reductive plasma treatment. As conductive materials, they are suitable for making touch electrodes such as the first touch electrodes 3 and the second touch electrodes 4. Accordingly, in some embodiments, the plurality of touch electrodes (e.g., the plurality of first touch electrodes 3 and the plurality of second touch electrodes 4) include a reductive plasma-treated metal oxide semiconductor material. Optionally, the plasma treatment includes a plasma treatment using $H_2$, $NH_3$, or $NO_2$. Optionally, the active layer 2 includes indium gallium zinc oxide, and the plurality of touch electrodes include a $H_2$ or $NH_3$ plasma-treated IGZO.

In some embodiments, the plurality of touch electrodes include a conductive material (e.g., a single metal or an alloy), and the active layer includes a semi-conductive material converted from the conductive material by a plasma treatment (e.g., an oxidative plasma treatment).

Referring to FIG. 4, the array substrate in the embodiment includes a gate insulating layer 1 on the base substrate. The active layer 2 is on a side of the gate insulating layer 1 distal to the base substrate. The gate electrode is on a side of the gate insulating layer 1 proximal to the base substrate. Various materials may be used for making the gate electrode, including, but are not limited to, aluminum, molybdenum, aluminum Neodymium (AlNd), copper, molybdenum Niobium (MoNb), and alloys thereof. Various materials may be used for making the gate insulating layer 1, including, but are not limited to, silicon oxide, silicon nitride, and silicon nitride oxide. Optionally, the gate insulating layer 1 has a thickness of around 3000 Å to around 5000 Å. Optionally, the active layer 2 has a thickness of around 400 Å to around 700 Å.

In some embodiments, the array substrate in the embodiment further includes an etch stop layer 5 on a side of the active layer 2 distal to the base substrate. Various materials may be used for making the etch stop layer 5, including, but are not limited to, silicon oxide. Optionally, the etch stop layer 5 has a thickness of around 1000 Å.

Referring to FIG. 4, the etch stop layer 5 in the embodiment has a first via and a second via in the area above the active layer 2. The array substrate includes a source electrode 6 and a drain electrode 7 on a side of the etch stop layer 5 distal to the active layer 2. The source electrode 6 is connected to the active layer 2 through a first via in the etch stop layer 5. The drain electrode 7 is connected to the active layer 2 through a second via in the etch stop layer 5. Various materials may be used for making the source electrode 6 and the drain electrode 7, including, but are not limited to, aluminum, molybdenum, aluminum Neodymium (AlNd), copper, molybdenum Niobium (MoNb), and alloys thereof.

Figure 5:
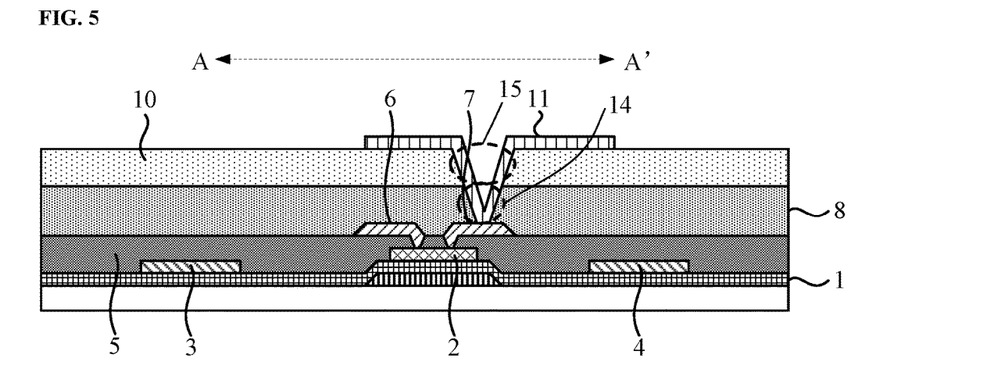
FIG. 5 is a cross-sectional view along the B-B' direction of the touch substrate in FIG. 3.

FIG. 5 is a cross-sectional view along the B-B' direction of the touch substrate in FIG. 3. Referring to FIG. 5, the array substrate in the embodiment further includes a first passivation layer 8 on a side of the etch stop layer 5 distal to the active layer 2. Various materials may be used for making the first passivation layer 8, including, but are not limited to, silicon oxide. Optionally, the first passivation layer 8 has a thickness of around 1500 Å to around 2000 Å.

In some embodiments, the first passivation layer 8 has a plurality of third vias 14 in the area corresponding to the first touch electrode 3. Specially, the array substrate further includes a plurality of first touch electrode connection lines 9 on a side of the first passivation layer 8 distal to the active layer 2. Each of the plurality of first touch electrode connection lines 9 extends substantially along the first direction (e.g., the row direction in FIG. 3). Each of the plurality of first touch electrode connection lines 9 is connected to the plurality of first touch electrodes 3 in each of the plurality of rows of first touch electrodes 3 through a plurality of third vias 14 in the first passivation layer 8.

In some embodiments, the first touch electrodes 3 and the second touch electrodes 4 are spaced apart and alternately arranged, e.g., along the first direction. The second touch electrodes 4 extend continuously along the second direction (e.g., the column direction in FIG. 3). Each row of the first touch electrodes 3 along the first direction includes a plurality of independent and spaced-apart first touch electrodes 3 connected together through the first touch electrode connection lines 9.

The number and density of the first touch electrodes 3 and the second touch electrodes 4 in the array substrate may be varied depending on several factors such as the size of the display panel. Typically, the touch electrodes are much larger than the pixels in size. In a typical display panel, for every dozens to hundreds of pixels, one row of first touch electrode 3 and one second touch electrode 4 may be disposed.

In some embodiments, the array substrate further includes a second passivation layer 10 on a side of the first passivation layer 8 distal to the active layer 2. Various materials may be used for making the second passivation layer 10, including, but are not limited to, silicon oxide. Optionally, the second passivation layer 10 has a thickness of around 1500 Å to around 2000 Å.

In some embodiments, the first passivation layer 8 has a plurality of fourth vias 14 in the area corresponding to the drain electrode 7, and the second passivation layer 10 has a plurality of fifth vias 15 in the area corresponding to the drain electrode 7. Specifically, the array substrate further includes a pixel electrode 11 on a side of the second passivation layer 10 distal to the active layer 2. The pixel electrode 11 is connected to the drain electrode 7 through a fourth via 14 in the first passivation layer 8 and a fifth via 15 in the second passivation layer 10.

In some embodiments, the touch electrodes (e.g., one or both of the first touch electrode and the second touch electrode) are operated in a time-division driving mode. For example, the first touch electrodes 3 and the second touch electrodes 4 can be used as common electrodes upon receiving a common voltage during display mode.

Figure 6:
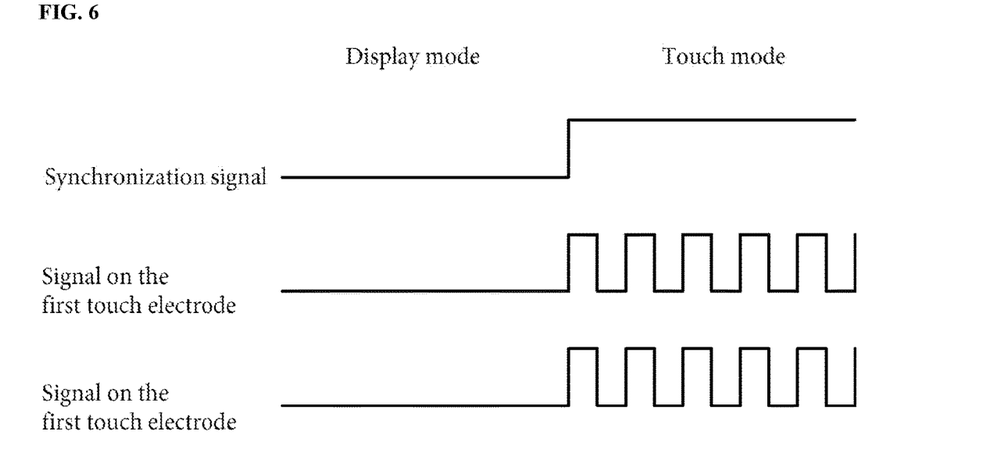
FIG. 6 illustrates the relationship between a signal input by a synchronization signal line and signals on the first touch control electrode and the second touch control electrode.

FIG. 6 illustrates the relationship between a signal input by a synchronization signal line and signals on the first touch control electrode and the second touch control electrode. Referring to FIG. 6, the first touch electrodes 3 and the second touch electrodes 4 can be used for conducting touch signals in touch control mode, or for applying common voltage in display mode. Thus, in touch control mode, the first touch electrodes 3 and/or the second touch electrodes 4 are used as touch electrodes. In display mode, they can be used as common electrodes. In addition to the main common electrodes in the array substrate, the touch electrodes (e.g., the first touch electrodes 3 and/or the second touch electrodes 4) may also be used as common electrodes for driving liquid crystal in certain areas of the display panel. The common electrode structure can thus be simplified.

In some embodiments, the array substrate further includes a common electrode on a side of the pixel electrode 11 distal to the active layer 2. A first common electrode connection line is connected to the common electrode. A second common electrode connection line is connected to the first touch electrode 3. A third common electrode connection line is connected to the second touch electrode 4. Optionally, the array substrate further includes a first switch in the second common electrode connection line and a second switch in the third common electrode connection line.

Figure 7:
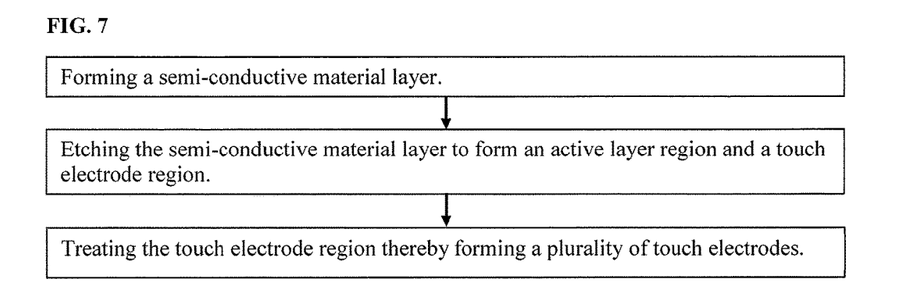
FIG. 7 is a flow chart illustrating a method of manufacturing a touch substrate in some embodiments.
Figure 8:
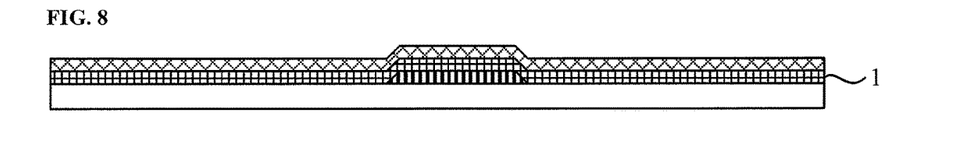
FIGS. 8-15 illustrate a method of manufacturing a touch substrate in some embodiments.
Figure 9:
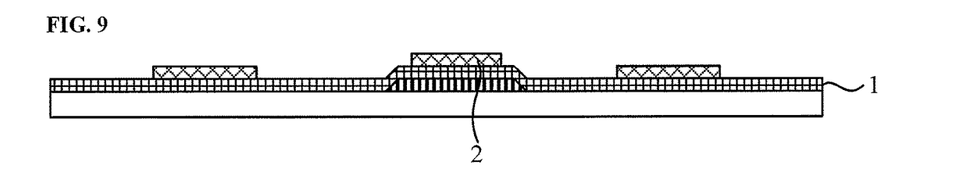

In another aspect, the present disclosure also provides a method of manufacturing an array substrate. FIG. 7 is a flow chart illustrating a method of manufacturing a touch substrate in some embodiments. FIGS. 8-15 illustrate a method of manufacturing a touch substrate in some embodiments. Referring to FIGS. 7-15, the method in the embodiment includes forming a semi-conductive material layer, etching the semi-conductive material layer to form an active layer region and a touch electrode region, and treating the touch electrode region thereby forming a plurality of touch electrodes.

Figure 10:
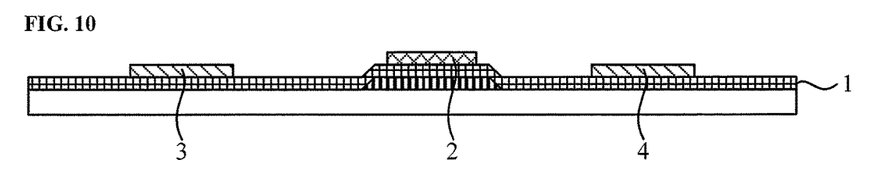
Figure 11:
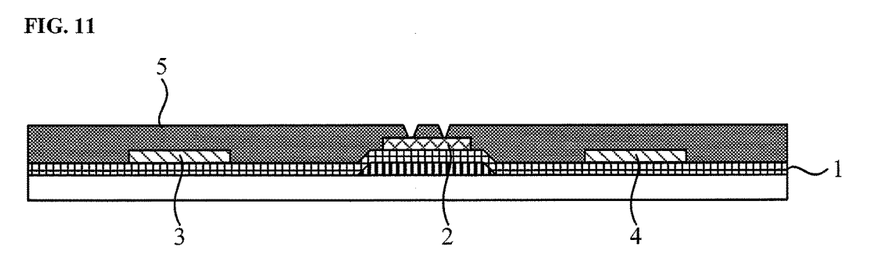

In some embodiments, the first material is a semi-conductive material. The method includes forming a semiconductor layer (FIG. 8); etching the semiconductor layer to form an active layer 2, a first touch electrode region and a second touch electrode region (FIG. 9); treating the first touch electrode region to form a plurality of first touch electrodes 3, and treating the second touch electrode region to form a plurality of second touch electrodes 4 (FIG. 10).

In some embodiments, the active layer 2 is protected when the touch electrode region is treated to form the touch electrodes. Various embodiments can be practiced to protect the active layer 2. In some embodiments, the method uses a photoresist layer to protect the active layer 2. Optionally, the method further includes coating a photoresist layer on the semi-conductive material layer, and exposing the photoresist layer with a gray-tone mask plate or a half-tone mask plate. After the exposure, the exposed photoresist layer is developed to obtain a photoresist pattern comprising a first section corresponding to the active layer region, second section corresponding to the touch electrode region, and a third section which is outside the first section and the second section. The depth of first section is larger than that of the second section, the photoresist layer is removed in the third section. Optionally, the method further includes etching the semi-conductive material layer in the third section, and ashing the photoresist layer to remove the photoresist layer in the second section while maintaining the photoresist layer in the third section. After the touch electrode region is treated to form the touch electrodes, the photoresist layer in the first section is then removed, exposing the active layer 2.

In some embodiments, the semi-conductive material includes a metal oxide semi-conductive material such as indium gallium zinc oxide. In some embodiments, the touch electrode region is treated with a reductive plasma. Optionally, the reductive plasma is a hydrogen-containing plasma, e.g., $H_2$, $NH_3$, or $NO_2$ plasma.

In some embodiments, the touch electrode region includes a plurality rows of first touch electrode blocks and a plurality of second touch electrode blocks. Each of the plurality rows of first touch electrode blocks extends substantially along a first direction. Each row of the first touch electrode blocks includes a plurality of first touch electrode blocks spaced apart along the first direction. Each of the plurality of second touch electrode blocks extends substantially along a second direction. The plurality of first touch electrodes 3 and the plurality of second touch electrodes 4 are formed after the treating steps discussed above. Optionally, the plurality of first touch electrodes 3 includes a plurality of rows of first touch electrodes 3. Each of the plurality rows of first touch electrodes 3 extends substantially along the first direction. Each row of the first touch electrodes 3 includes a plurality of first touch electrodes 3 spaced apart along the first direction. Each of the plurality of second touch electrodes 4 extends substantially along the second direction.

In some embodiments, the method further includes forming a gate insulating layer 1 above the active layer 2.

Figure 12:
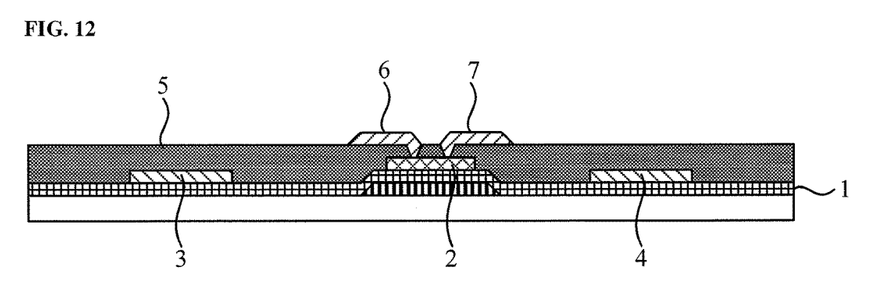
Figure 13:
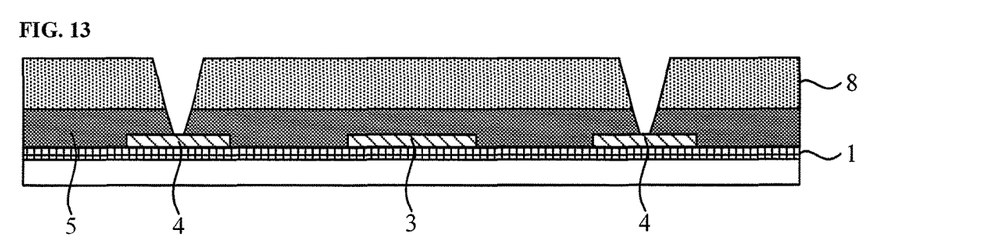

In some embodiments, the method further includes forming an etch stop layer 5 above the active layer 2, forming a first via and a second via in the etch stop layer 5 (FIG. 11), and forming a source electrode 6 and a drain electrode 7 on a side of the etch stop layer 5 distal to the active layer 2 (FIG. 12). The source electrode 6 is connected to the active layer 2 through the first via. The drain electrode 7 is connected to the active layer 2 through the second via.

Figure 14:
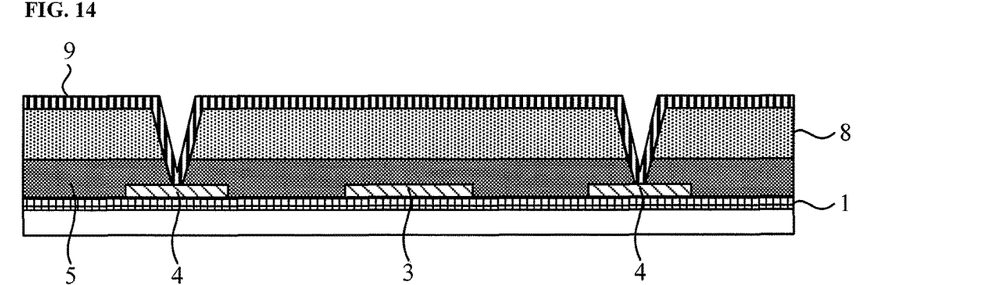
Figure 15:
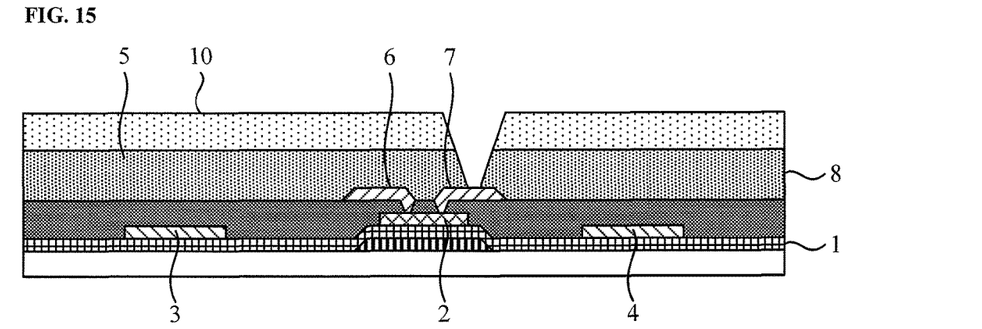

In some embodiments, the method further includes forming a first passivation layer 8 on a side of the etch stop layer 5 distal to the active layer 2 (FIG. 13); forming a plurality of third vias 14 in the first passivation layer 8 (FIG. 13); forming a plurality of first touch electrode connection lines 9 on a side of the first passivation layer 8 distal to the active layer 2 (FIG. 14). Each of the plurality of first touch electrode connection lines 9 extends substantially along the first direction. Each of the plurality of first touch electrode connection lines 9 is connected to the plurality of first touch electrodes 3 in each of the plurality rows of first touch electrodes 3 through the plurality of third vias 14.

In some embodiments, the method further includes forming a fourth via in the first passivation layer 8; forming a second passivation layer 10 on a side of the first passivation layer 8 distal to the active layer 2; forming a fifth via in the second passivation layer 10; and forming a pixel electrode 11 on a side of the second passivation layer 10 distal to the active layer 2. The pixel electrode 11 is connected to the drain electrode 7 through the fourth via and the fifth via.

In some embodiments, the method further includes forming a common electrode on a side of the pixel electrode 11 distal to the active layer 2; forming a first common electrode connection line connected to the common electrode, forming a second common electrode connection line connected to the first touch electrode 3, and forming a third common electrode connection line connected to the second touch electrode 4. Optionally, the method also includes forming a first switch in the second common electrode connection line and/or forming a second switch in the third common electrode connection line. During display mode, the first switch and the second switch are configured to receiving common voltage, and the first touch electrode 3 and the second touch electrode 4 may be used as common electrodes in certain areas of the display panel.

The method described herein may use any appropriate techniques. For example, layers can be formed by vapor deposition or sputtering. The various components may be patterned by, e.g., an etching process.

As discussed above, in conventional touch control devices, a separate patterning process is required for forming the touch electrodes in the conventional touch substrates. The embodiments of the present disclosure provide a touch substrate having superior electronic properties and much simplified manufacturing process. By having the touch electrodes (e.g., the first touch electrodes 3 and the second touch electrodes 4) in a same layer as the active layer 2, it obviates a separate patterning process for forming the first touch electrodes 3 and/or the second touch electrodes 4. It also reduces the thickness of the touch control structure. The manufacturing process is much simplified and the electronic properties of the touch control panel are significantly improved.

The touch control devices as described herein can be a self-capacitive touch control device or a mutual capacitive touch control device. A mutual capacitive touch control device includes a plurality of touch sensing electrodes and a plurality of touch scanning electrodes (e.g., a plurality of first touch electrodes and a plurality of second touch electrodes). A self-capacitive touch control device does not require a touch scanning electrode, i.e., the touch sensing electrodes can achieve the touch control function alone.

In another aspect, the present disclosure further provides a display device having an array substrate described herein or manufactured by a method described herein. The display device may be of any type, including, but are not limited to, an electronic paper, a mobile phone, a tablet computer, a notebook computer, a digital picture frame, a navigation system, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
   a base substrate;
   an active layer;
   a plurality of touch electrodes configured to detect a touch, the plurality of touch electrodes being in a same layer as the active layer;
   a gate electrode in a layer different from the active layer and the plurality of touch electrode;
   a pixel electrode;
   a plurality of touch electrode connection lines, each of which electrically connected to one of the plurality of touch electrodes; and
   a passivation layer on a side of the active layer and the plurality of touch electrode distal to the base substrate;
   wherein the active layer comprises a semi-conductive material, and the plurality of touch electrodes comprise a conductive material, the conductive material comprises at least one element in common with the semi-conductive material;
   an orthographic projection of the active layer on the base substrate is substantially non-overlapping with orthographic projections of the plurality of touch electrodes on the base substrate, and at least partially overlaps with an orthographic projection of the gate electrode on the base substrate;
   the orthographic projection of the gate electrode on the base substrate is substantially non-overlapping with the orthographic projections of the plurality of touch electrodes on the base substrate; and the active layer and the plurality of touch electrodes are in direct contact with a same insulating layer, without any intermediate structure, on a same side of the same insulating layer facing the passivation layer.

2. The array substrate of claim 1, wherein the active layer comprises a metal oxide semi-conductive material, the plurality of touch electrodes comprise a reductive plasma-treated metal oxide semi-conductive material.

3. The array substrate of claim 2, wherein the metal oxide semi-conductive material comprises indium gallium zinc oxide.

4. The array substrate of claim 2, wherein the plurality of touch electrodes comprise a $H_2$ or $NH_3$ plasma-treated indium gallium zinc oxide.

5. The array substrate of claim 1, wherein the plurality of touch electrodes are operated in a time-division driving mode.

6. The array substrate of claim 1, wherein the plurality of touch electrodes comprise a metal, and the active layer comprises an oxidative plasma-treated metal material.

7. The array substrate of claim 1, wherein the plurality of touch electrodes comprises a plurality rows of first touch electrodes and a plurality of second touch electrodes, each of the plurality rows of first touch electrodes extends substantially along a first direction and comprises a plurality of first touch electrodes spaced apart along the first direction; and each of the plurality of second touch electrodes extends substantially along a second direction different from the first direction.

8. The array substrate of claim 7, further comprising:
a first passivation layer above the active layer; and
a plurality of first touch electrode connection lines on a side of the first passivation layer distal to the active layer, each of the plurality of first touch electrode connection lines extends substantially along the first direction;
wherein each of the plurality of first touch electrode connection lines is electrically connected to the plurality of first touch electrodes in one of the plurality rows of first touch electrodes through a plurality of third vias in the first passivation layer.

9. An array substrate, comprising:
an active layer;
a plurality of touch electrodes in a same layer as the active layer, the plurality of touch electrodes comprises a plurality rows of first touch electrodes and a plurality of second touch electrodes, each of the plurality rows of first touch electrodes extends substantially along a first direction and comprises a plurality of first touch electrodes spaced apart along the first direction; each of the plurality of second touch electrodes extends substantially along a second direction different from the first direction;
a first passivation layer above the active layer;
a second passivation layer on a side of the first passivation layer distal to the active layer;
a pixel electrode on a side of the second passivation layer distal to the active layer; and
a plurality of first touch electrode connection lines on a side of the first passivation layer distal to the active layer, each of the plurality of first touch electrode connection lines extends substantially along the first direction;
wherein the active layer comprises a semi-conductive material, and the plurality of touch electrodes comprise a conductive material, the conductive material comprises at least one element in common with the semi-conductive material;
each of the plurality of first touch electrode connection lines is electrically connected to the plurality of first touch electrodes in one of the plurality rows of first touch electrodes through a plurality of third vias in the first passivation layer; and
the pixel electrode is electrically connected to a drain electrode through a fourth via in the first passivation layer and a fifth via in the second passivation layer.

10. The array substrate of claim 5, wherein the time-division driving mode comprises a display mode and a touch control mode;
the plurality of touch electrodes are common electrodes for applying common voltage signal during the display mode; and
the plurality of touch electrodes are touch control electrodes for conducting touch signals during the touch control mode.

11. A display apparatus comprising an array substrate of claim 1.

12. A method of fabricating an array substrate, comprising:
forming an active layer and a plurality of touch electrodes in a same layer on a base substrate, the plurality of touch electrodes formed to detect a touch;
forming a gate electrode in a layer different from the active layer and the plurality of touch electrode;
forming a pixel electrode;
forming a plurality of touch electrode connection lines, each of which formed to be electrically connected to one of the plurality of touch electrodes; and
forming a passivation layer on a side of the active layer and the plurality of touch electrode distal to the base substrate;
wherein the active layer is formed to comprise a semi-conductive material, and the plurality of touch electrodes are formed to comprise a conductive material, the conductive material comprises at least one element in common with the semi-conductive material;
the active layer and the plurality of touch electrodes are formed so that an orthographic projection of the active layer on the base substrate is substantially non-overlapping with orthographic projections of the plurality of touch electrodes on the base substrate, and at least partially overlaps with an orthographic projection of the gate electrode on the base substrate;
the gate electrode is formed so that the orthographic projection of the gate electrode on the base substrate is substantially non-overlapping with the orthographic projections of the plurality of touch electrodes on the base substrate; and
the active layer and the plurality of touch electrodes are formed so that the active layer and the plurality of touch electrodes are in direct contact with a same insulating layer, without any intermediate structure, on a same side of the same insulating layer facing the passivation layer.

13. The method of claim 12, wherein forming an active layer and a plurality of touch electrodes comprises:
forming a semi-conductive material layer;
etching the semi-conductive material layer to form an etched semi-conductive material layer having a first part and a second part, the first part being the active layer; and
treating the second part thereby forming the plurality of touch electrodes.

14. The method of claim 13, wherein the semi-conductive material comprises a metal oxide semi-conductive material, and treating the second part comprises treating the second part by a reductive plasma-treatment.

15. The method of claim 14, wherein the semi-conductive material comprises indium gallium zinc oxide; and treating the second part comprises treating the second part by a plasma treatment with $H_2$ or $NH_3$.

16. The method of claim 12, wherein
forming the plurality of touch electrodes comprises forming a plurality rows of first touch electrodes and a plurality of second touch electrodes, each of the plurality rows of first touch electrodes formed to extend substantially along a first direction and comprise a plurality of first touch electrodes spaced apart along the first direction; and each of the plurality of second touch electrodes extends formed to extend substantially along a second direction different from the first direction.

17. The method of claim 16, further comprising:
forming a first passivation layer above the active layer;
forming a plurality of third vias in the first passivation layer; and
forming a plurality of first touch electrode connection lines on a side of the first passivation layer distal to the active layer;
wherein each of the plurality of first touch electrode connection lines extends substantially along the first direction, and each of the plurality of first touch electrode connection lines is electrically connected to the plurality of first touch electrodes in each of the plurality rows of first touch electrodes through the plurality of third vias.

18. The array substrate of claim 9, further comprising:
a common electrode on a side of the pixel electrode distal to the active layer;
a first common electrode connection line electrically connected to the common electrode, a second common electrode connection line electrically connected to the plurality rows of first touch electrodes, and a third common electrode connection line electrically connected to the plurality of second touch electrodes; and
a first switch in the second common electrode connection line and a second switch in the third common electrode connection line.

19. The array substrate of claim 8, further comprising:
an etch stop layer on a side of the active layer proximal to the first passivation layer; and
a source electrode and a drain electrode on a side of the etch stop layer distal to the active layer; the source electrode electrically connected to the active layer through a first via in the etch stop layer, the drain electrode electrically connected to the active layer through a second via in the etch stop layer.

20. The array substrate of claim 8, wherein the pixel electrode is electrically connected to a drain electrode of a thin film transistor; and wherein the plurality of first touch electrode connection lines are in a different layer from the pixel electrode.

* * * * *